United States Patent
Uribe

(10) Patent No.: US 12,014,787 B2
(45) Date of Patent: Jun. 18, 2024

(54) TECHNIQUES FOR DETERMINING AN INTERFACE CONNECTION STATUS

(71) Applicant: Micron Technology, Inc., Boise, ID (US)

(72) Inventor: Melissa I. Uribe, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 144 days.

(21) Appl. No.: 17/657,063

(22) Filed: Mar. 29, 2022

(65) Prior Publication Data

US 2023/0317191 A1    Oct. 5, 2023

(51) Int. Cl.
| G11C 29/02 | (2006.01) |
| G11C 11/4076 | (2006.01) |
| G11C 11/4099 | (2006.01) |
| H03K 19/20 | (2006.01) |

(52) U.S. Cl.
CPC ........ *G11C 29/022* (2013.01); *G11C 11/4076* (2013.01); *G11C 11/4099* (2013.01); *G11C 29/021* (2013.01); *H03K 19/20* (2013.01)

(58) Field of Classification Search
CPC .............. G11C 29/022; G11C 11/4076; G11C 11/4099; G11C 29/021; H03K 19/20
USPC ........................................................ 365/198
See application file for complete search history.

(56) References Cited

U.S. PATENT DOCUMENTS

| 10,128,842 | B1* | 11/2018 | Lin | .................... H03K 19/0005 |
| 11,335,386 | B1* | 5/2022 | Hong | ............... G11C 29/50008 |
| 2019/0058474 | A1* | 2/2019 | Tzafrir | ................. G11C 29/023 |
| 2021/0011655 | A1* | 1/2021 | He | ........................ G06F 3/0688 |
| 2022/0365892 | A1* | 11/2022 | Chen | .................. G06F 13/1673 |
| 2023/0069656 | A1* | 3/2023 | Lee | ................... G11C 11/40622 |
| 2023/0268021 | A1* | 8/2023 | Wei | .................... G11C 29/1201 |
| | | | | 365/201 |
| 2023/0305752 | A1* | 9/2023 | Buxton | .............. G11C 16/0483 |
| | | | | 711/103 |

FOREIGN PATENT DOCUMENTS

CN          110299160 A    * 10/2019      ......... G11C 11/4074

* cited by examiner

*Primary Examiner* — Fernando Hidalgo
(74) *Attorney, Agent, or Firm* — Holland & Hart LLP

(57) ABSTRACT

Methods, systems, and devices for techniques for determining an interface connection status are described. A system may include an interface between a host device and a memory device. The host device may transmit to the memory device first data in a pattern over a first set of transmission lines of the interface. The host device may also transmit to the memory device second data in the pattern over a second set of transmission lines of the interface. The memory device may compare the first data and the second data, and based on the comparison, send an indication of a connection status of the interface to the host device.

24 Claims, 8 Drawing Sheets

TECHNIQUES FOR DETERMINING AN INTERFACE CONNECTION STATUS

FIELD OF TECHNOLOGY

The following relates to one or more systems for memory, including techniques for determining an interface connection status.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
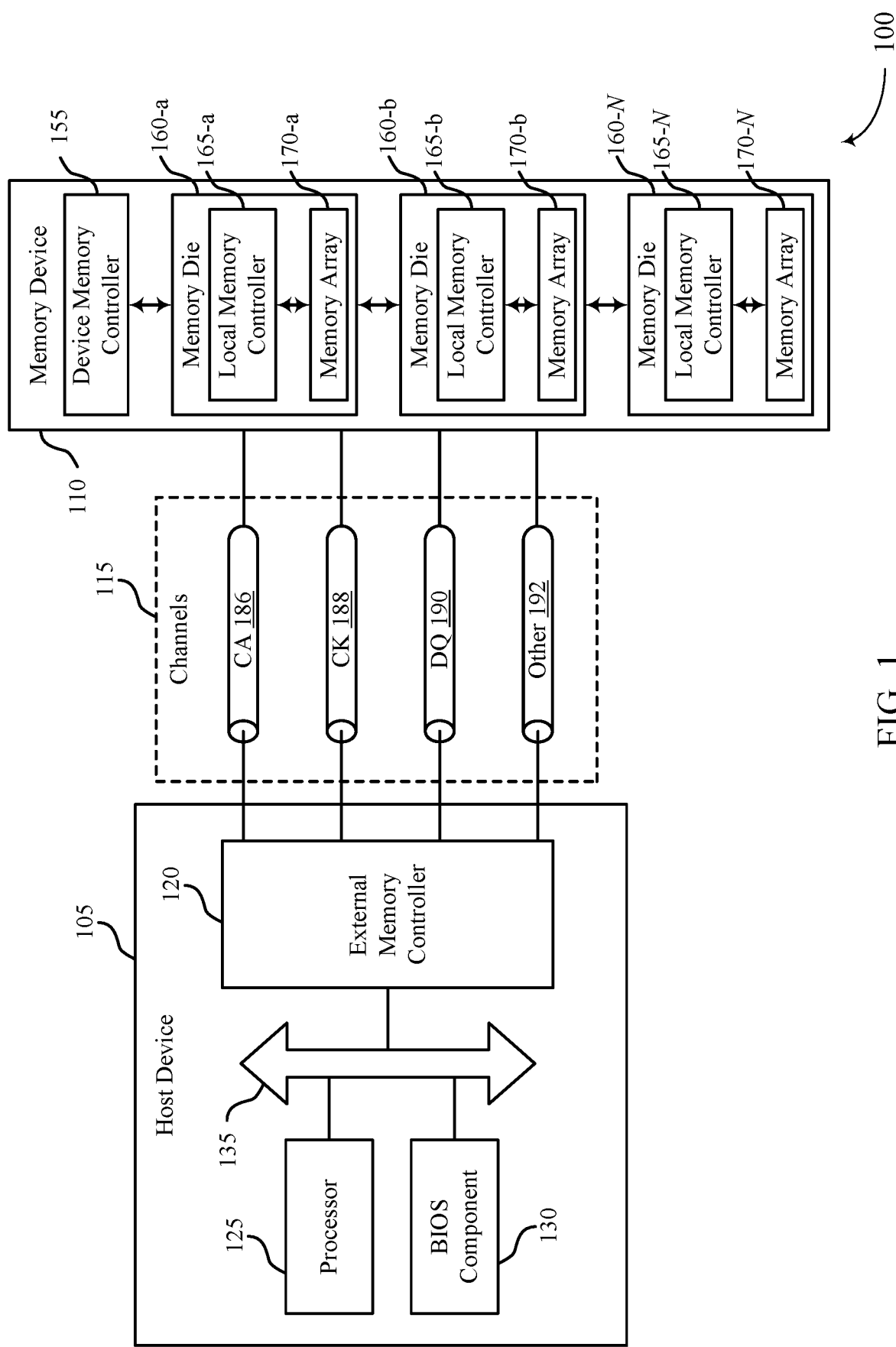
FIG. 1 illustrates an example of a system that supports techniques for determining an interface connection status in accordance with examples as disclosed herein.

In some systems, a host device may communicate (e.g., receive, transmit, exchange) signals with a memory device using an interface that is between the host device and the memory device. The interface may include transmission lines that are configured to convey electrical signals between the host device and the memory device. To detect faulty connections in the interface (which may also be referred to as incorrect connections) at, for example, a manufacturing or testing stage of the system, the host device may initiate a process in which data is transmitted back and forth over the interface between the host device and the memory device. But such a process may have substantial latency (e.g., on the order of seconds in some examples) and may risk loss of data in the memory device (e.g., because no refreshes are performed during the scan), among other disadvantages. So, use of a such a process to detect faulty connections may be unsuitable for a system that is deployed (e.g., in the field by a user), and may be particularly unsuitable for a system that is subject to strict reliability metrics (e.g., a system that is part of a vehicle such as a self-driving vehicle).

According to the techniques described herein, a system may implement a scan, for example, a low-latency boundary scan, that allows the system to quickly determine the connection status of the interface between the host device and the memory device without risking data loss at the memory device. The boundary scan may be used during manufacturing (e.g., to detect manufacturing faults) or in the field (e.g., to detect faults over the lifetime of the system).

To implement the boundary scan, the host device may place the memory device in a boundary scan mode and transmit a same data pattern over two different sets of transmission lines in the interface. As part of operating in the boundary scan mode, the memory device may compare the data patterns (e.g., the instances of the same data pattern) and use the results of the comparison to determine the connection status of the interface. For example, if the comparison indicates that the data patterns received over the two different sets of transmission lines are different, the memory device may determine that the interface has a faulty connection. After determining the connection status of the interface, the memory device may indicate the connection status to the host device so that the host device can take appropriate action. For example, if the system is incorporated in a vehicle (e.g., a self-driving vehicle), the host device may cause the system to enter a safe mode in which the vehicle pulls over to the side of the road or in which control of the vehicle is transferred from the vehicle to a user (e.g., driver) of the vehicle, among other examples.

Features of the disclosure are initially described in the context of systems and dies as described with reference to FIGS. 1 and 2. Features of the disclosure are described in the context of a system and a process flow as described with reference to FIGS. 3 and 4. These and other features of the disclosure are further illustrated by and described with reference to an apparatus diagram and flowcharts that relate to techniques for determining an interface connection status as described with reference to FIGS. 5-8.

FIG. 1 illustrates an example of a system 100 that supports techniques for determining an interface connection status in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s) (e.g., input devices, output devices). The I/O controller may manage peripherals that are not integrated into or with the system 100 or the host device 105. In some examples, the I/O controller may represent a physical connection (e.g., one or more ports) with external peripheral components.

In some examples, the system 100 or the host device 105 may include an input component, an output component, or both. An input component may represent a device or signal external to the system 100 that provides information (e.g., signals, data) to the system 100 or its components. In some examples, and input component may include an interface (e.g., a user interface or an interface between other devices). In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105.

Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

In some examples, clock signal channels 188 may be operable to communicate one or more clock signals between the host device 105 and the memory device 110. Clock signals may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate information (e.g., data, control information)

between the host device 105 and the memory device 110. For example, the data channels 190 may communicate information (e.g., bi-directional) to be written to the memory device 110 or information read from the memory device 110. The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some examples, the channels 115 may be part of an interface that is between the host device 105 and the memory device 110. A channel may refer to a transmission line and the termination pins of the transmission line (e.g., the termination pin at the host device 105 and the termination pin at the memory device 110).

To determine whether a channel 115 has a faulty connection (which may also be referred to as an incorrect connection), the system 100 may implement a boundary scan as described herein. As part of the boundary scan, the host device 105 may prompt the memory device 110 into the boundary scan mode and transmit a data pattern over two different sets of channels 115. In the boundary scan mode, the memory device 110 may compare the data patterns received over the two different sets of channels 115 and determine the connection status of the interface based on whether the data patterns are the same or different. The memory device 110 may then indicate the connection status to the host device 105 so that the host device can use the connection status to determine next operations (e.g., whether to enter a safe mode).

The boundary scan described herein may be faster than other techniques and, unlike other techniques that suspend refresh operations for the memory device 110, may ensure data preservation in the memory device 110 by allowing refresh operations to be performed during the boundary scan.

Figure 2:
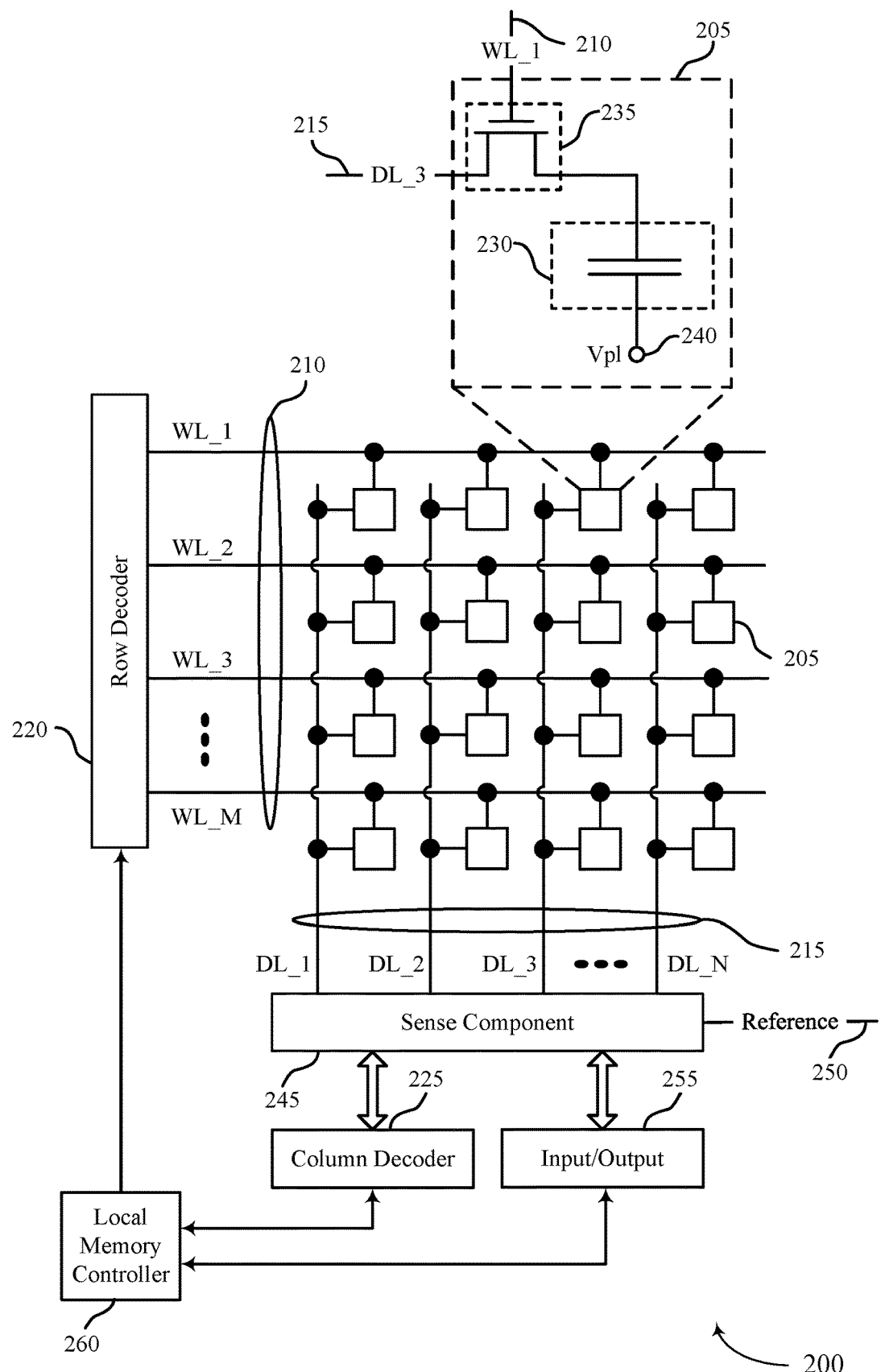
FIG. 2 illustrates an example of a memory die that supports techniques for determining an interface connection status in accordance with examples as disclosed herein.

FIG. 2 illustrates an example of a memory die 200 that supports techniques for determining an interface connection status in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210 and digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or a combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some examples, the memory die 200 may be included in a memory device that is coupled with a host device via an interface. The interface may include various transmission lines that are configured to communicate information between the host device and the memory device. For example, the interface may include transmission lines (e.g., DQ transmission lines) that are configured to communicate data as well as transmission lines (e.g., command/address (C/A) transmission lines) that are configured to communicate command and address information, among other transmission lines.

Some systems may support a process to detect faulty interface connections at the manufacturing or testing stage of the system. But faulty connections may arise after a system is deployed in the field (e.g., due to degradation, corrosion), where use of such a process are unsuitable for latency reasons, data loss reasons, or both. If a deployed system with a faulty interface connection is unable to detect the faulty connection in a timely manner, the system may experience a failure, which may be life-threatening in certain scenarios. For example, if the system is part of a vehicle (e.g., a self-driving vehicle or a driver-assist vehicle), a faulty connection may ultimately result in a collision.

A faulty connection may refer to a pin or a transmission line that is open (e.g., disconnected from a termination point) or a pin or a transmission line that has a short (e.g., a connection to a voltage source, a connection to a ground reference, a connection to another transmission line). As an example of how a faulty connection can lead to failure, consider a C/A transmission line that is open. In such a scenario, the host device may transmit an address over interface (e.g., via the C/A transmission lines) and the memory device may receive the wrong address. So, the memory device may perform a memory access operation on the wrong address and access the wrong data.

To prevent such an error from occurring, a memory device may check for faulty interface connections by entering the boundary scan mode described herein. In the boundary scan mode, the memory device may receive data patterns over different sets of transmission lines. For example, the memory device may receive a first data pattern over a first set of transmission lines (e.g., C/A transmission lines) and may receive a second data pattern over a second set of transmission lines (e.g., DQ transmission lines and data mask inversion (DMI) transmission lines). If the first data pattern and the second data pattern are identical, the memory device may determine that the interface has correct connections. If the first data pattern and the second data pattern are different, the memory device may determine that the interface has at least one faulty connection. The memory device may indicate the connection status of the interface to a host device so that the host device can use the connection status as basis for decisions, such as whether to enter a safe mode.

Figure 3:
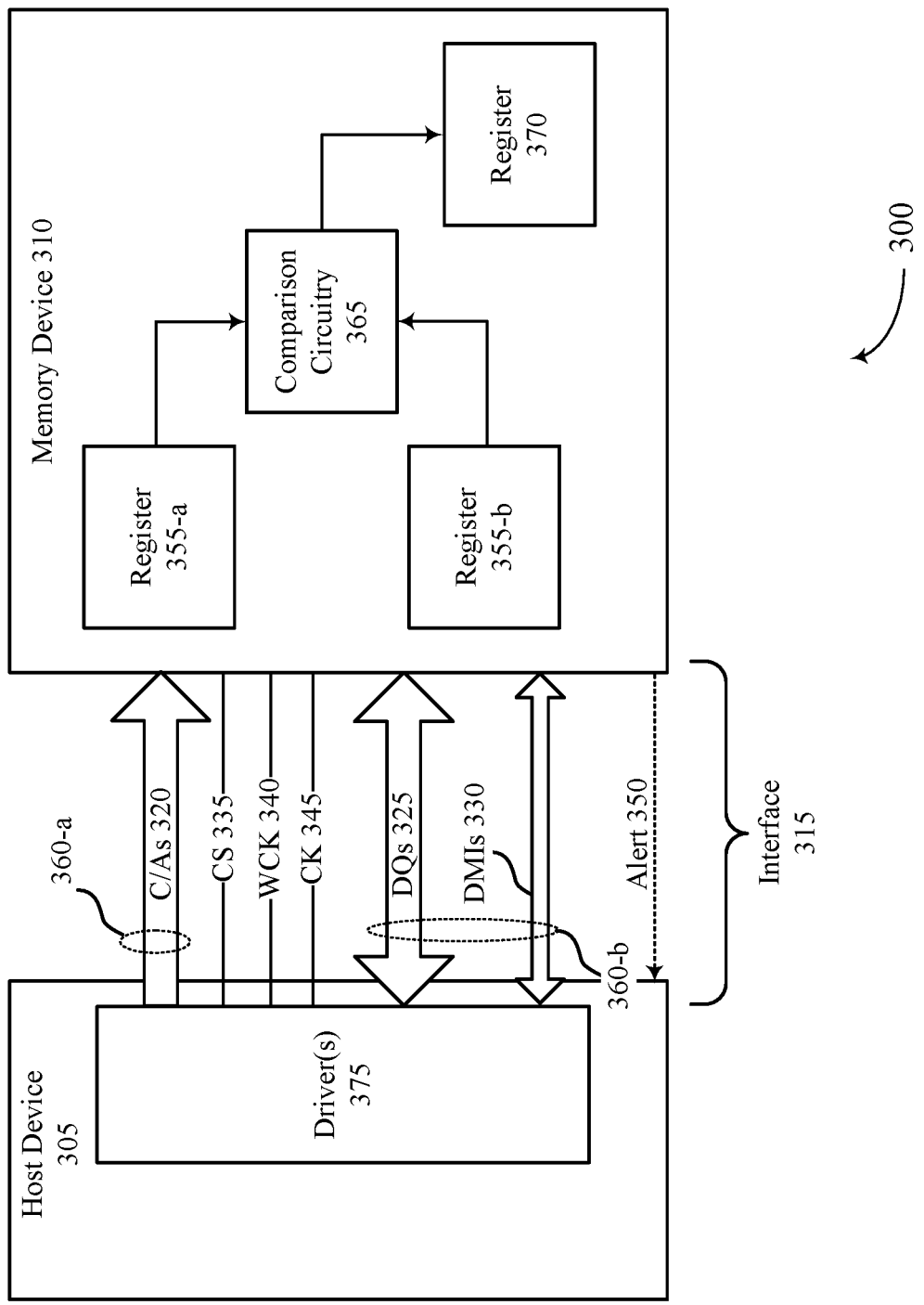
FIG. 3 illustrates an example of a system that supports techniques for determining an interface connection status in accordance with examples as disclosed herein.

FIG. 3 illustrates an example of a system 300 that supports techniques for determining an interface connection status in accordance with examples as disclosed herein. The system 300 may include a host device 305 and a memory device 310. The host device 305 may be an example of a host device 105 as described with reference to FIG. 1 and the memory device 310 may be an example of a memory device 110 as described with reference to FIG. 1. The system 300 may also include an interface 315 that is coupled with, and configured to convey information between, the host device 305 and the memory device 310. Together, the host device 305 and the memory device 310 may implement a boundary scan to determine the connection status of the interface 315.

The interface 315 may include a variety of transmission lines that are coupled with, and configured to convey information between (e.g., to or from or both to and from), the host device 305 and the memory device 310. For example, the interface 315 may include: C/A transmission lines 320, which may be configured to communicate command and address information; data (DQ) transmission lines 325, which may be configured to communicate data; and data mask inversion (DMI) transmission lines 330 (also referred to as control transmission lines), which may be configured to communicate control information.

Additionally, the interface 315 may include: a chip select (CS) transmission line 335, which may be configured to communicate control information; write clock (WCK) transmission line 340, which may be configured to communicate a first clock signal for write operations; and a clock (CK) transmission line 345, which may be configured to communicate a second clock signal. In some examples, the interface 315 may also include an alert transmission line 350, which may be configured to convey connection status information for the interface 315. A transmission lines may be terminated by a respective pin (e.g., a conductive node) at each device.

The host device 305 may include one or more driver(s) 375 that are configured to transmit information in the form of electrical signals over the transmission lines of the interface 315. During a boundary scan, the driver(s) 375 may transmit identical data patterns over a first set of transmission lines 360-*a* (e.g., the C/A transmission lines 320) and a second set of transmission lines 360-*b* (e.g., the data transmission lines 325 and the DMI transmission lines 330).

The driver(s) 375 may cycle through one or more data patterns that may be selected to reveal different information about the connection status of the interface 315. For example, referring to Table 1, the driver(s) 375 may send data pattern A and data pattern B over both the first set of transmission lines 360-*a* and the second set of transmission lines 360-*b* so that the system 300 can determine first whether each transmission line is able to convey both a '0' and a '1' and second whether adjacent transmission lines are shorted together.

If the first set of transmission lines 360-*a* has a different quantity of transmission lines than the second set of transmission lines, the data patterns may be split across multiple rounds of transmission. For example, if the first set of transmission lines 360-*a* has seven transmission lines and the second set of transmission lines 360-*b* has eighteen transmission lines (e.g., sixteen data transmission lines 325 and two DMI transmission lines 330), data pattern A (which may be 18 bits long) may be transmitted over the second set of transmission lines 360-*b* in one round (e.g., during one write clock cycle) and may be transmitted over the first set of transmission lines 360-*a* in three rounds (e.g., during three write clock cycles).

Table 1 illustrates data pattern A and data pattern B, as well as how the data patterns may be transmitted over the first set of transmission lines ("1st Set") and the second set of transmission lines ("2nd Set"). In Table 1, different rounds of transmission over a given set of transmission lines are indicated by brackets. For example, the first seven bits of data pattern A may be transmitted over the first set of transmission lines 360-*a* in a first round (e.g., during a first clock cycle), the next seven bit bits of data pattern A may be transmitted over the first set of transmission lines 360-*a* in a second round (e.g., during a second clock cycle), and the last four bits of data pattern A may be transmitted over a subset of the first set of transmission lines 360-*a* in a third round (e.g., during a third clock cycle). Because the size of data pattern A (e.g., the quantity of bits) matches the quantity of transmission lines in the second set of transmission lines 360-*b*, all eighteen bits of data pattern A may be transmitted (e.g., in parallel) over the second set of transmission lines in a first round (e.g., during a clock cycle). A given data pattern may be transmitted over the two different sets of transmission lines 360 at partially overlapping times (e.g., concurrently) or at different times (e.g., non-overlapping times).

TABLE 1

Pattern A: 010101010101010101
1st Set: [0101010] [1010101] [0101xxx] 2nd Set: [010101010101010101]
Pattern B: 101010101010101010
1st Set: [1010101] [0101010] [1010xxx] 2nd Set: [101010101010101010]

Table 2 shows other examples of data patterns that may be used to detect faulty connections in the interface 315. The data patterns in Table 2 may be selected so that different combinations of values are transmitted over adjacent transmission lines, which may allow the system 300 to detect shorts and open connections in the transmission lines. The data patterns shown in Table 2 may be transmitted over the first set of transmission lines 360-*a* and the second set of transmission lines 360-*b* in a manner similar to data pattern A and data pattern B.

TABLE 2

Pattern C: 100100100100100100
Pattern D: 011011011011011011
Pattern E: 110011001100110011
Pattern F: 001100110011001100

The data patterns discussed herein are provided for illustrative purposes and are not limiting. Similarly, the quantity of transmission lines in each set of transmission lines are provided for illustrative purposes and are not limiting.

The memory device 310 may be configured to compare data patterns received from the host device 305 to determine the connection status of the interface 315. In some examples, the memory device 310 may include one or more registers 355 to store data patterns for comparison. For example, the memory device may include register 355-*a*, which may be configured to store data patterns received over the first set of transmission lines 360-*a*, and register 355-*b*, which may be configured to store data patterns received over the second set of transmission lines 360-*b*. The registers 355 may be coupled with comparison circuitry 365 and may be configured to communicate data patterns for comparison to the comparison circuitry 365.

The comparison circuitry 365 may be configured to compare data patterns by performing one or more logic operations on the data patterns. For example, the comparison circuitry 365 may be configured to compare a first data pattern and a second data pattern by performing a logic XNOR operation on the first data pattern and the second data pattern. If the data patterns compared by the memory device 310 are different, the memory device 310 may determine that the interface 315 has at least one faulty connection. For instance, if a C/A transmission line is shorted to a voltage supply, the data pattern received over the C/A transmission lines 320 may be different than the data pattern transmitted by the host device 305 (e.g., the host device 305 may transmit a '0' over the transmission line but because the transmission line is shorted to the voltage supply the memory device 310 may receive a '1').

In some examples, the comparison circuitry 365 may include a quantity of gates such as XNOR gates. An XNOR logic gate may output a logic '0' if the inputs (e.g., bits from the sets of transmission lines 360) are different and may output a logic '1' if the inputs are the same. So, an XNOR comparison of two data patterns may result in all '1s' if the data patterns are identical and may result in one or more '0s' if the data patterns are different. As an example, the comparison circuitry 365 may output '111' if data pattern '000' is compared to data pattern '000.' However, the comparison circuitry 365 may output '110' if data pattern '000' is compared to data pattern '001."

So, in an XNOR scenario, the presence of a '0' in the results of a comparison between two data patterns may indicate that there is a faulty connection in the interface 315. If the transmission lines are ground-terminated, use of XNOR logic gates to compare data patterns may allow the host device 305 to detect a faulty connection even if there's an issue with communicating connection status information (because the default status of the transmission lines is '0,' which indicates a faulty connection). Although described with reference to XNOR gates, other examples of logic gates and comparators may be included in the comparison circuitry 365. For example, if the transmission lines are terminated at a high voltage, use of XOR gates to compare data patterns may allow the host device 305 to detect a faulty connection even if there's an issue with communicating connection status information (because the default status of the transmission lines is '1,' which indicates a faulty connection).

The register 370 may be coupled with the comparison circuitry 365 and may be configured to store the results of data pattern comparisons for transmission to the host device 305. In some examples, the register 370 may be a mode register.

In some examples, the memory device 310 may indicate the connection status of the interface 315 by transmitting the comparison results for data patterns to the host device 305, by transmitting an alert signal (e.g., one or more bits) with a value that is associated with the connection status, or both. If the memory device 310 uses the comparison results to indicate the connection status, the memory device 310 may transmit the comparison results over the interface 315 (e.g., over second set of transmission lines 360-*b*). The memory device 310 may transmit the comparison results in response to a request from the host device 305, in response to completing the comparison, or in response to completing the boundary scan (which may involve multiple data patterns whose comparison results are stored at the register 370). Upon receipt of the comparison results, the host device 305 may determine the connection status of the interface 315 based on the comparison results.

The comparison results may include a quantity of bits each of which indicates whether corresponding bits of two received data patterns are the same or different. Referring to Table 3 as an illustration in the XNOR context, if the ninth bit of a first data pattern received over the first set of transmission lines 360-*a* is different than the ninth bit of a second pattern received over the second set of transmission lines 360-*b*, the comparison results may be all '1s' except the ninth bit, which may be a '0' to indicate that the ninth bits of the two data patterns are different. Thus, the comparison results may indicate that there is a faulty connection in the interface 315.

TABLE 3

1st Received Pattern: 010101010101010101
2nd Received Pattern: 010101011101010101
Comparison Results: 111111110111111111

In some examples, the memory device 310 may use the comparison results to determine the connection status and may indicate the connection status of the interface 315 by transmitting an alert signal with a value that is associated with the connection status. For example, if the memory device 310 determines that the interface is free of faulty connections, the memory device may transmit a '1' that indicates as much. If the memory device 310 determines that the interface has one or more faulty connections, the memory device may transmit a '0' that indicates as much. So, in some examples, the alert signal may be a 1-bit flag (e.g., a special function enable (DSF) flag). The alert signal may be transmitted over the alert transmission line 350 or over one or more DMI transmission lines 330. In some examples, the host device 305 may request the comparison results from the register 370 after receiving the alert signal (e.g., to obtain more information about the connections of the interface 315).

Upon receipt of an indication of the connection status, the host device 305 may determine the connection status and operate based on the connection status. For example, if the host device 305 determines that the interface 315 has one or more faulty connections, the host device 305 may enter a safe mode in which information from the memory device 310 is discarded as unreliable. If the system 300 is part of a vehicle (e.g., a self-driving vehicle or a driver-assist vehicle), the host device 305 may cause the system 300 to enter a safe mode in which the vehicle is pulled over to the side of the road or in which control of the vehicle is transferred from the vehicle to the driver, among other options.

Thus, the host device 305 and the memory device 310 may work together to implement a boundary scan to determine the connection status of the interface 315.

Figure 4:
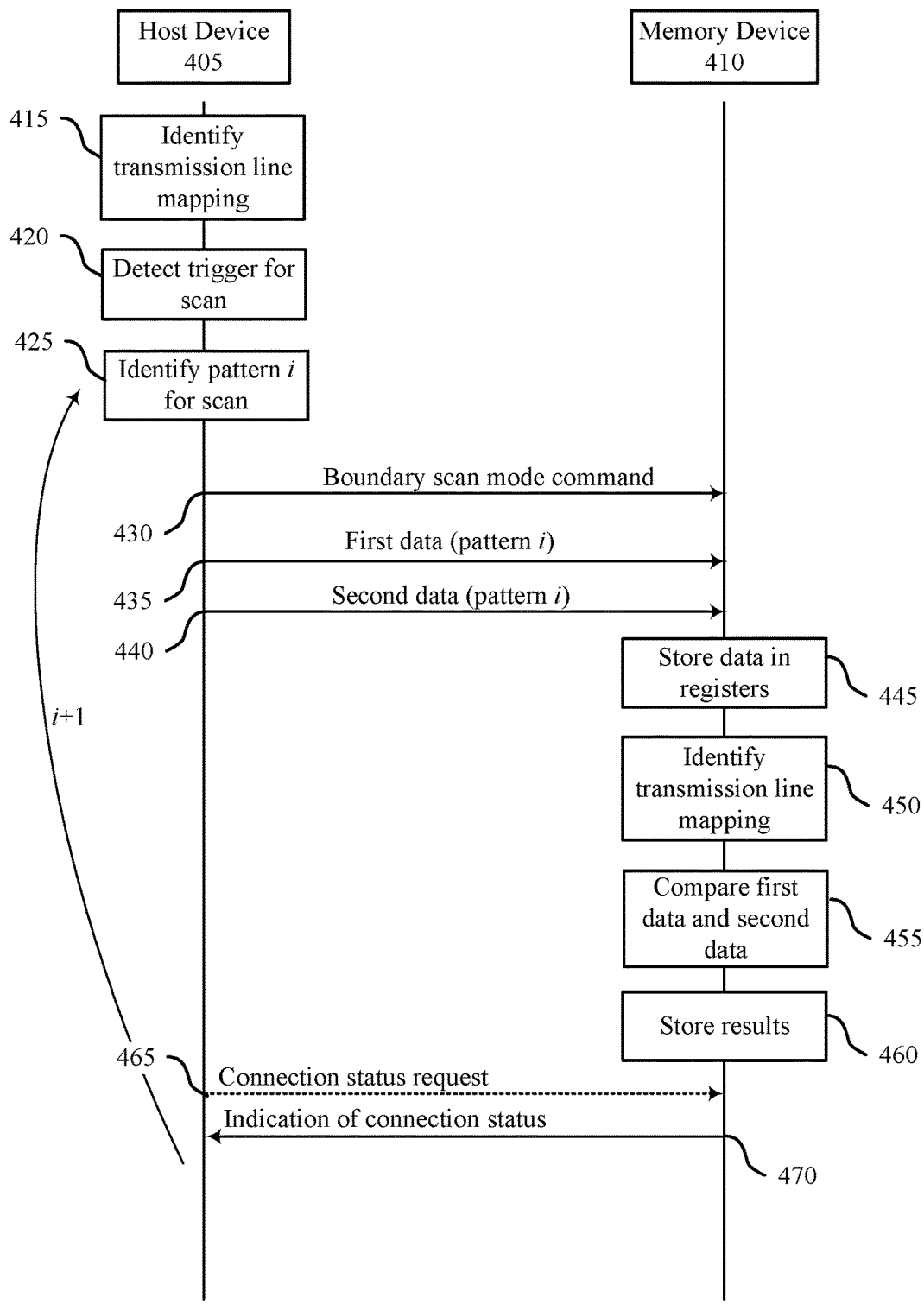
FIG. 4 illustrates an example of a process flow that supports techniques for determining an interface connection status in accordance with examples as disclosed herein.

FIG. 4 illustrates an example of a process flow 400 that supports techniques for determining an interface connection status in accordance with examples as disclosed herein. The process flow 400 may be implemented by a host device 405 and a memory device 410, which may be examples of a host device and a memory device, respectively, as described herein. Implementation of the process flow 400 may allow the host device 405, the memory device 410, or both to determine the connection status of an interface between the host device 405 and the memory device 410. The interface may include a first set of transmission lines and a second set of transmission lines, among other transmission lines.

At 415, the host device 405 may identify a mapping between a first set of transmission lines and a second set of transmission lines. In some examples the first set of transmission lines includes the C/A transmission lines 320 and the second set of transmission lines includes the data transmission lines 325 and the DMI transmission lines 330. The mapping may associate each transmission line in the first set of transmission lines with one or more transmission lines in the second set of transmission lines, or vice versa depending on the relative quantities of transmission lines in each set. Put another way, the mapping may associate each transmission line in the first set of transmission lines and the second set of transmission lines with a respective bit position of a data pattern. An example mapping is illustrated in Table 4.

TABLE 4

| 1st Set Transmission Lines | 2nd Set Transmission Lines | Data Pattern Bit Position |
|---|---|---|
| 0 (First Round) | 0 | 0 |
| 1 (First Round) | 1 | 1 |
| 2 (First Round) | 2 | 2 |
| 3 (First Round) | 3 | 3 |
| 4 (First Round) | 4 | 4 |
| 5 (First Round) | 5 | 5 |
| 6 (First Round) | 6 | 6 |
| 7 (First Round) | 7 | 7 |
| 0 (Second Round) | 8 | 8 |
| 1 (Second Round) | 9 | 9 |
| 2 (Second Round) | 10 | 10 |
| 3 (Second Round) | 11 | 11 |
| 4 (Second Round) | 12 | 12 |
| 5 (Second Round) | 13 | 13 |
| 6 (Second Round) | 14 | 14 |
| 7 (Second Round) | 15 | 15 |
| 0 (Third Round) | 16 | 16 |
| 1 (Third Round) | 17 | 17 |

Mapping the transmission lines may allow the host device 405 to transmit the data pattern across the transmission lines in a predetermined and consistent manner so the memory device 410 can determine which bits to compare from the two sets of transmission lines.

If there are more transmission lines in the first set of transmission lines than the second set of transmission lines, as illustrated in Table 4, some or all of the transmission lines in the first set of transmission lines may be mapped to multiple transmission lines of the second set of transmission lines (and may be mapped to multiple bit positions of the data pattern). For example, according to the mapping in Table 4, the host device 405 may transmit the logic value for bit position 0 of the data pattern on transmission line 0 of the first set of transmission lines (e.g., during a first clock cycle) and on transmission line 0 of the second set of transmission lines (e.g., during the first clock cycle). The host device 405 may transmit the logic value for bit position 8 of the data pattern on transmission line 0 of the first set of transmission lines (e.g., during a second clock cycle) and on transmission line 8 of the second set of transmission lines (e.g., during the first clock cycle). And the host device 405 may transmit the logic value for bit position 17 of the data pattern on transmission line 0 of the first set of transmission lines (e.g., during a third clock cycle) and on transmission line 17 of the second set of transmission lines (e.g., during the first clock cycle).

At 420, the host device 405 may detect a trigger for performing a boundary scan. For example, the host device 405 may determine that a condition for performing a boundary scan has been satisfied. In some examples, the host device 405 may determine that a timer for running a boundary scan has expired. The host device 405 may reset the timer between boundary scans so that the boundary scans are performed periodically (e.g., each time the timer expires).

At 425, the host device 405 may identify a data pattern to use for the boundary scan. For example, the host device 405 may identify data pattern i to use for the boundary scan. In some examples, the host device 405 may identify the data pattern in response to detecting the trigger for performing the boundary scan.

At 430, the host device 405 may transmit to the memory device 410 a command that indicates the memory device 410 is to enter the boundary scan mode. In some examples, the command may be a mode register write (MWR) command that causes the memory device 410 to set or reset a bit of a mode register that is associated with the boundary scan. The memory device 410 may enter the boundary scan mode in response to the command. Unlike other techniques, which may not support refresh operations, the memory device 410 may continue to perform refresh operations on one or more memory array(s) of the memory device 410 while in the boundary scan mode so that data stored in the memory array(s) is preserved during the boundary scan.

At 435, the host device 405 may transmit to the memory device 410 first data in (e.g., according to, in accordance with) the data pattern i over the first set of transmission lines. In some examples, the first data may be divided into subsets of bits that are transmitted during different clock cycles (e.g., in different rounds). At 440, the host device may transmit to the memory device 410 second data in the data pattern i over the second set of transmission lines. The transmissions at 435 and 440 may occur at different times (e.g., during different clock cycles) or at partially overlapping times (e.g., during one or more same clock cycles).

In some examples, the host device 405 may transmit the first data, the second data, or both, synchronously with a clock signal, such as the write clock signal that is transmitted over the write clock transmission line 340. Transmitting data synchronously with the write clock signal may refer to aligning the bits of the data with the pulses of the write clock and may allow detection of a faulty connection for the write clock transmission line 340. However, in other examples the host device 405 may transmit the first data, the second data, or both, asynchronously with the write clock signal. Transmitting data asynchronously with the write clock signal may refer to offsetting the bits of the data from the pulses of the write clock.

In some examples, the host device 405 may pulse (e.g., intermittently energize) the chip select transmission line 335 during transmission of the first data and the second data, which may allow detection of a faulty connection for the chip select transmission line 335. For example, the memory device 310 may determine that the chip select transmission line 335 has a faulty connection if the memory device 310 receives all '0s' or all '1s' over the chip select transmission line 335 during transmission of the first data and the second data.

If the interface has a faulty connection, the first data received by the memory device 410 and the second data received by the memory device 410 may have different patterns. For example, the first data may be in a first pattern and the second data may be in a second pattern that is different than the first pattern. Otherwise (e.g., if the interface is free of faulty connections), the first data received by the memory device 410 and the second data received by the memory device 410 may have the same pattern (e.g., data pattern i).

At 445, the memory device 410 may store the first data and the second data in one or more registers (e.g., the registers 355). At 450, the memory device 410 may identify the mapping between transmission lines. The memory device 410 may identify the mapping based on the command received at 430. In some examples, the mapping may be stored in a local memory of the memory device 410. In some examples, the mapping may be indicated to the memory device 410 from the host device 405. The mapping may allow the memory device 410 to determine the correct bits to compare from the two sets of transmission lines. For example, the memory device 410 may determine that the bit received over transmission line x of the first set of transmission lines during a clock cycle should be compared to the bit received over transmission line y of the second set of transmission lines during the clock cycle.

At 455, the memory device 410 may compare the first data with the second data. For example, the memory device 410 may perform a bit-by-bit comparison of the first data and the second data. The comparisons may be performed in parallel (e.g., at partially or wholly overlapping times) or serially (e.g., at different times). In some examples, the memory device 410 may perform the comparison by performing a logic operation, such as an XNOR operation, on the first data and the second data. The memory device 410 may compare the first data with the second data after communicating the first data and the second data to comparison circuitry (e.g., the comparison circuitry 365).

At 460, the memory device 410 may store the results of the comparison at a register (e.g., the register 370). In some examples, the register may be a mode register. At 465, the host device 405 may transmit to the memory device 410 a request for the connection status of the interface between the host device 405 and the memory device 410. In some examples, the request may be a mode register read (MRR) command to read the comparison results stored in the register.

At 470, the memory device 410 may transmit an indication of the connection status for the interface. The memory device 410 may transmit the indication in response to the request received at 465 or independent of a prompt from the host device 405. In some examples, the indication may be the comparison results for the first data and the second data. In some examples, the memory device 410 may use the comparison results to determine the connection status and, in such examples, the indication may be a 1-bit flag (e.g., an alert signal) with a value that corresponds to the connection status of the interface. In some examples, the memory device 410 may transmit the alert signal followed by the comparison results, which may provide additional information about the connection status. For example, the alert signal may indicate that the interface has one or more faulty connection(s) and the comparison results may indicate which transmission line(s) have the incorrection connection(s).

Although described with reference to a single data pattern, various operations of the process flow 400 may repeat for additional data patterns. For example, after performing the operations between 425 and 470 for data pattern i, the host device 405 may perform the operations between 425 and 470 for another data pattern i+1. And so on and so forth for additional data patterns.

Figure 5:
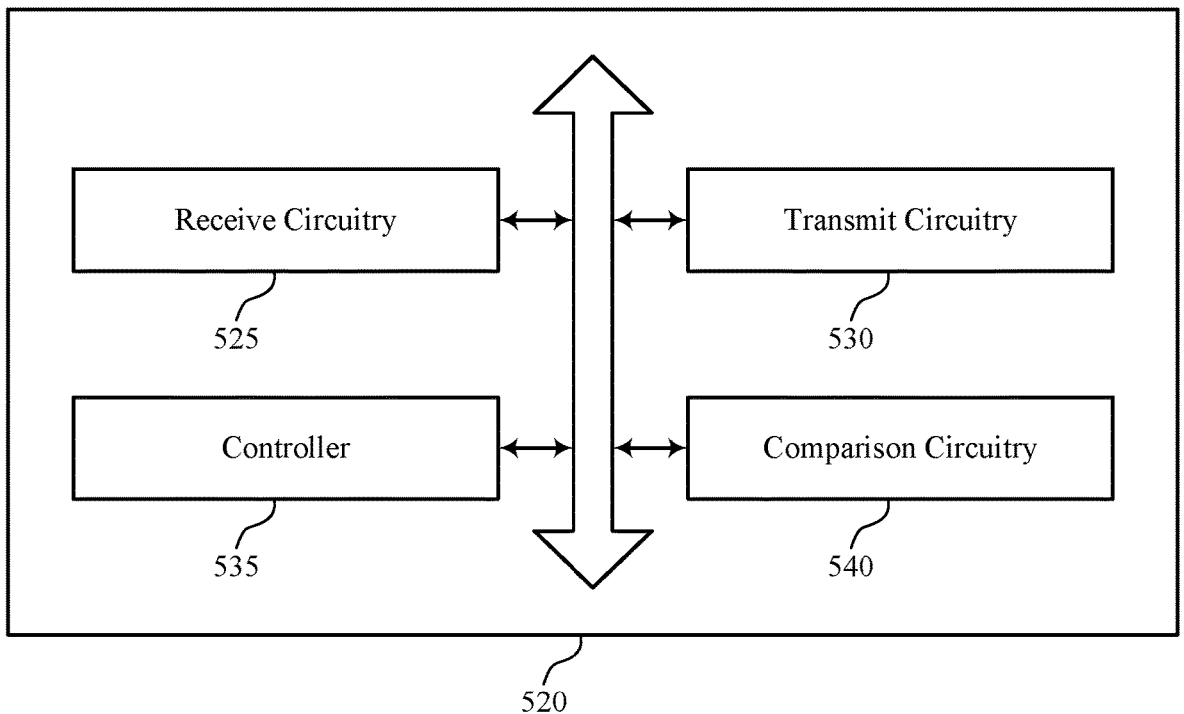
FIG. 5 shows a block diagram of a memory device that supports techniques for determining an interface connection status in accordance with examples as disclosed herein.

Thus, host device 405 and the memory device 410 may implement the process flow 400 to determine the connection status of the interface between the host device 405 and the memory device 410. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle FIG. 5 shows a block diagram 500 of a memory device 520 that supports techniques for determining an interface connection status in accordance with examples as disclosed herein. The memory device 520 may be an example of aspects of a memory device as described with reference to FIGS. 1 through 4. The memory device 520, or various components thereof, may be an example of means for performing various aspects of techniques for determining an interface connection status as described herein. For example, the memory device 520 may include a receive circuitry 525, a transmit circuitry 530, a controller 535, a comparison circuitry 540, or any combination thereof. Each of these components may communicate, directly or indirectly, with one another (e.g., via one or more buses).

The receive circuitry 525 may be configured as or otherwise support a means for receiving, at a memory device, a command that indicates the memory device is to enter a mode for determining a connection status of an interface between a host device and the memory device. In some examples, the receive circuitry 525 may be configured as or otherwise support a means for receiving, based at least in part on receiving the command, first data in a first pattern over a first set of transmission lines and second data in a second pattern over a second set of transmission lines, where the interface includes the first set of transmission lines and the second set of transmission lines. The transmit circuitry 530 may be configured as or otherwise support a means for transmitting, based at least in part on receiving the first data and the second data, an indication of the connection status of the interface.

In some examples, the controller 535 may be configured as or otherwise support a means for determining that the first pattern and the second pattern are the same, where the indication of the connection status indicates that the interface has correct connections.

In some examples, the controller 535 may be configured as or otherwise support a means for determining that the first pattern and the second pattern are different, where the indication of the connection status indicates that the interface has a faulty connection.

In some examples, the faulty connection includes an open transmission line or a short between a transmission line of the interface and a voltage source, between a transmission line of the interface and a voltage source a ground reference, or between a transmission line of the interface and another transmission line of the interface.

In some examples, the comparison circuitry 540 may be configured as or otherwise support a means for comparing the first data to the second data. In some examples, the controller 535 may be configured as or otherwise support a means for determining the connection status based at least in part on the comparison, where the indication of the connection status is transmitted based at least in part on determining the connection status.

In some examples, the controller 535 may be configured as or otherwise support a means for determining a mapping between the first set of transmission lines and the second set of transmission lines, where the comparison of the first data to the second data is based at least in part on the mapping.

In some examples, the controller 535 may be configured as or otherwise support a means for determining, based at least in part on the mapping, that a first transmission line of the first set of transmission lines is mapped to a second transmission line of the second set of transmission lines, where the comparison includes comparing a first bit of the first data received over the first transmission line to a first bit of the second data received over the second transmission line.

In some examples, to support comparing the first data and the second data, the comparison circuitry 540 may be configured as or otherwise support a means for performing an XNOR operation on the first data and the second data. In some examples, the receive circuitry 525 may be configured as or otherwise support a means for receiving a request for the connection status of the interface, where the indication of the connection status is transmitted based at least in part on the request.

In some examples, the receive circuitry 525 may be configured as or otherwise support a means for receiving, after receiving the first data and the second data, third data in a third pattern over the first set of transmission lines and fourth data in a fourth pattern over the second set of transmission lines, where the indication of the connection status of the interface is based at least in part on the third data and the fourth data. In some examples, the first set of transmission lines is configured for communication of command and address information. In some examples, the second set of transmission lines includes a first subset of transmission lines configured for communication of data and a second subset of transmission lines configured for communication of control information.

In some examples, the receive circuitry 525 may be configured as or otherwise support a means for receiving a clock signal over a transmission line of the interface, where the first data and the second data are received synchronously with the clock signal. In some examples, the comparison circuitry 540 may be configured as or otherwise support a means for comparing the first data to the second data, where the indication includes a set of bits representative of a result of the comparison.

Figure 6:
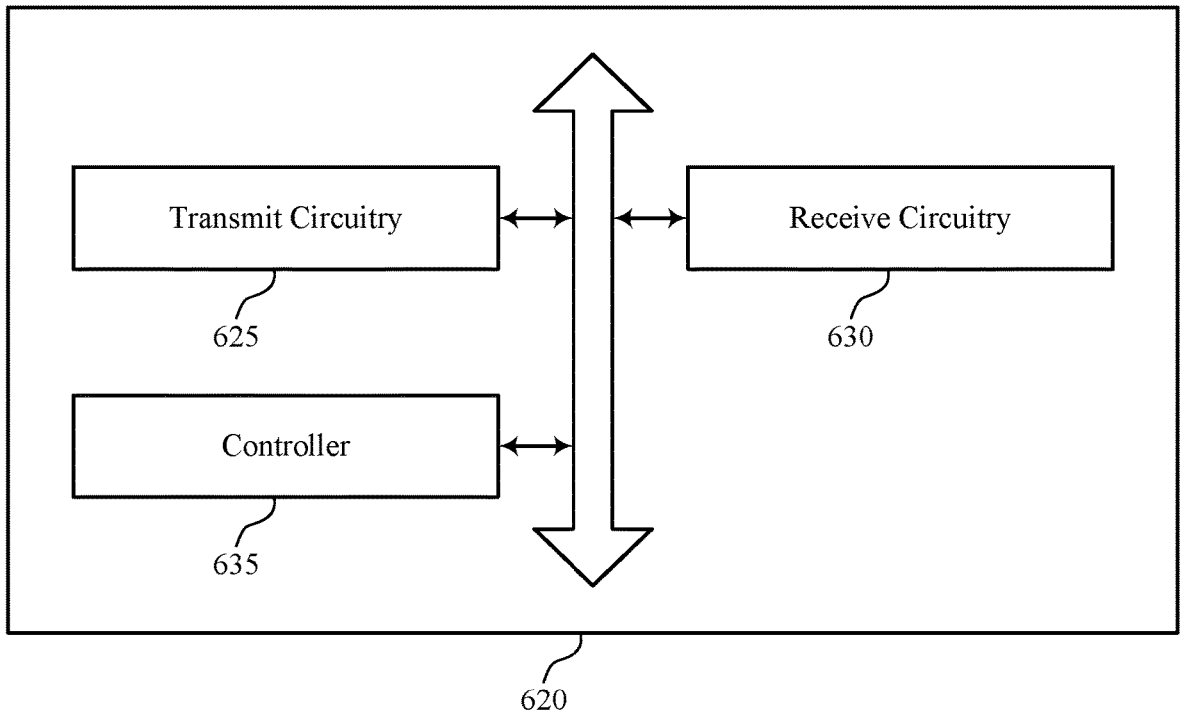
FIG. 6 shows a block diagram of a host device that supports techniques for determining an interface connection status in accordance with examples as disclosed herein.

FIG. 6 shows a block diagram 600 of a host device 620 that supports techniques for determining an interface connection status in accordance with examples as disclosed herein. The host device 620 may be an example of aspects of a host device as described with reference to FIGS. 1 through 4. The host device 620, or various components thereof, may be an example of means for performing various aspects of techniques for determining an interface connection status as described herein. For example, the host device 620 may include a transmit circuitry 625, a receive circuitry 630, a controller 635, or any combination thereof. Each of these components may communicate, directly or indirectly, with one another (e.g., via one or more buses).

The transmit circuitry 625 may be configured as or otherwise support a means for transmitting, at a host device, a command that indicates a memory device is to enter a mode for determining a connection status of an interface between the host device and a memory device. In some examples, the transmit circuitry 625 may be configured as or otherwise support a means for transmitting, to the memory device based at least in part on transmitting the command, first data according in a pattern over a first set of transmission lines and second data in the pattern over a second set of transmission lines, where the interface includes the first set of transmission lines and the second set of transmission lines. The receive circuitry 630 may be configured as or otherwise support a means for receiving, based at least in part on transmitting the first data and the second data, an indication of the connection status of the interface.

In some examples, the indication of the connection status indicates that the interface has a faulty connection, and the controller 635 may be configured as or otherwise support a means for entering a safe mode based at least in part on the indication of the connection status indicating that the interface has a faulty connection.

In some examples, to support entering the safe mode, the controller 635 may be configured as or otherwise support a means for indicating for the vehicle to pull over. In some examples, to support entering the safe mode, the controller 635 may be configured as or otherwise support a means for transferring control of the vehicle from the vehicle to a user of the vehicle.

In some examples, the faulty connection includes an open transmission line or a short between a transmission line of the interface and a voltage source, between a transmission line of the interface and a ground reference, or between a transmission line of the interface and another transmission line of the interface.

In some examples, the transmit circuitry 625 may be configured as or otherwise support a means for transmitting, after transmitting the first data and the second data, a request for the connection status, where the indication of the connection status is received based at least in part on transmitting the request.

In some examples, the controller 635 may be configured as or otherwise support a means for determining that a timer for checking the connection status of the interface has expired, where the command to enter the mode for determining the connection status of the interface is transmitted based at least in part on the timer expiring.

In some examples, the controller 635 may be configured as or otherwise support a means for determining a mapping between the first set of transmission lines and the second set of transmission lines, where the first data and the second data are transmitted based at least in part on the mapping.

In some examples, the controller 635 may be configured as or otherwise support a means for determining, based at least in part on the mapping, that a first transmission line of the first set of transmission lines is mapped to a second transmission line of the second set of transmission lines, where a first bit of the first data is transmitted over the first transmission line and a first bit of the second data is transmitted over the second transmission line based at least in part on the first transmission line being mapped to the second transmission line.

In some examples, the transmit circuitry 625 may be configured as or otherwise support a means for transmitting, to the memory device and based at least in part on transmitting the command, third data representative of a second pattern over the first set of transmission lines and fourth data representative of the second pattern over the second set of transmission lines, where the indication of the connection status is based at least in part on transmitting the third data and the fourth data.

In some examples, the command includes a write command for a mode register of the memory device. In some examples, the first set of transmission lines is configured for communication of command and address information. In some examples, the second set of transmission lines includes a first subset of transmission lines configured for communication of data and a second subset of transmission lines configured for communication of control information. In some examples, the transmit circuitry 625 may be configured as or otherwise support a means for transmitting a clock signal over a transmission line of the interface, where the first data and the second data are transmitted synchronously with the clock signal.

Figure 7:
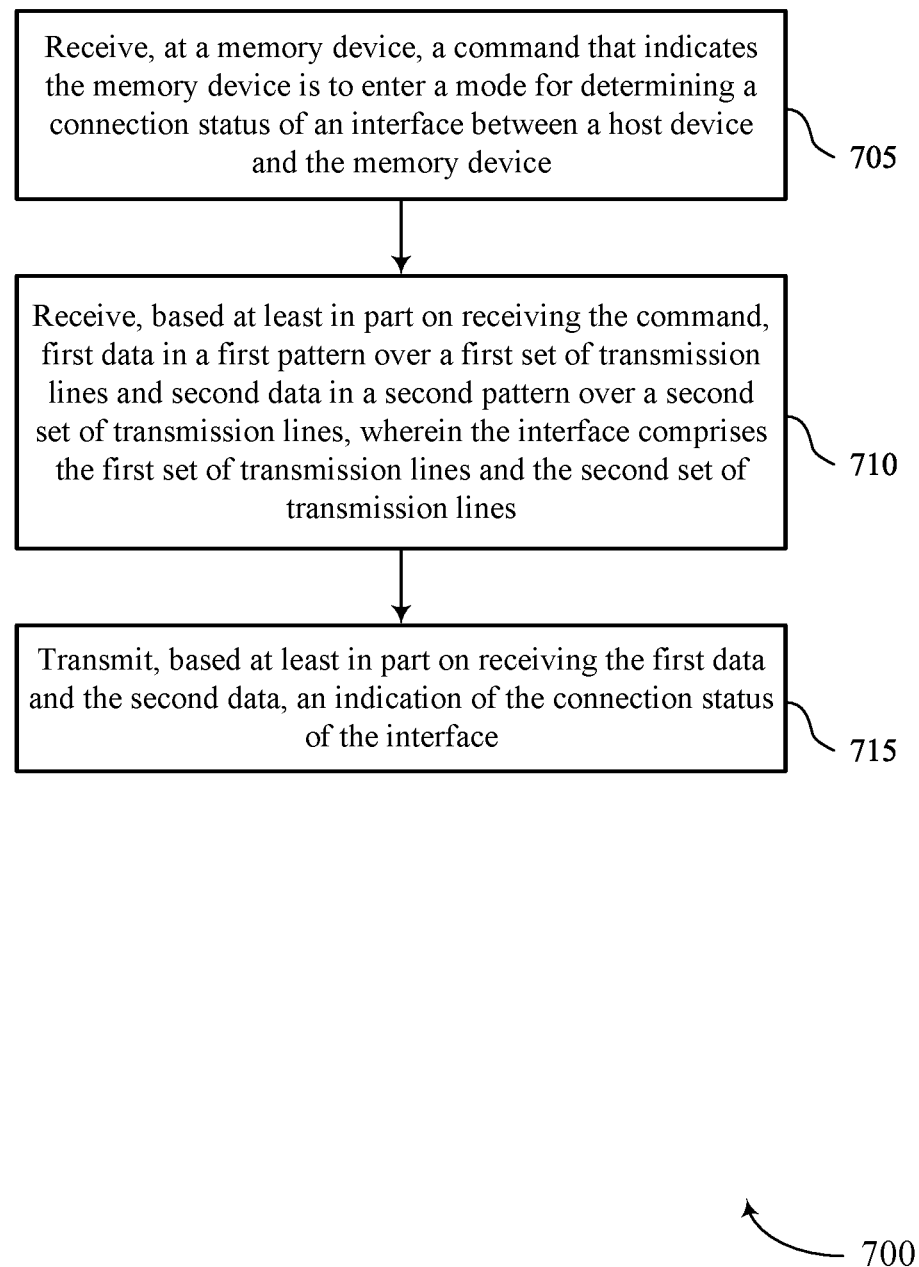
FIGS. 7 and 8 show flowcharts illustrating a method or methods that support techniques for determining an interface connection status in accordance with examples as disclosed herein.

FIG. 7 shows a flowchart illustrating a method 700 that supports techniques for determining an interface connection status in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 705, the method may include receiving, at a memory device, a command that indicates the memory device is to enter a mode for determining a connection status of an interface between a host device and the memory device. The operations of 705 may be performed in accordance with examples as disclosed herein. In some examples, aspects of the operations of 705 may be performed by a receive circuitry 525 as described with reference to FIG. 5.

At 710, the method may include receiving, based at least in part on receiving the command, first data in a first pattern over a first set of transmission lines and second data in a second pattern over a second set of transmission lines, where the interface includes the first set of transmission lines and the second set of transmission lines. The operations of 710 may be performed in accordance with examples as disclosed herein. In some examples, aspects of the operations of 710 may be performed by a receive circuitry 525 as described with reference to FIG. 5.

At 715, the method may include transmitting, based at least in part on receiving the first data and the second data, an indication of the connection status of the interface. The operations of 715 may be performed in accordance with examples as disclosed herein. In some examples, aspects of the operations of 715 may be performed by a transmit circuitry 530 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory device, a command that indicates the memory device is to enter a mode for determining a connection status of an interface between a host device and the memory device; receiving, based at least in part on receiving the command, first data in a first pattern over a first set of transmission lines and second data in a second pattern over a second set of transmission lines, where the interface includes the first set of transmission lines and the second set of transmission lines; and transmitting, based at least in part on receiving the first data and the second data, an indication of the connection status of the interface.

Aspect 2: The method, apparatus, or non-transitory computer-readable medium of aspect 1, further including operations, features, circuitry, logic, means, or instructions, or any combination thereof for determining that the first pattern and the second pattern are the same, where the indication of the connection status indicates that the interface has correct connections.

Aspect 3: The method, apparatus, or non-transitory computer-readable medium of any of aspects 1 through 2, further including operations, features, circuitry, logic, means, or instructions, or any combination thereof for determining that the first pattern and the second pattern are different, where the indication of the connection status indicates that the interface has a faulty connection.

Aspect 4: The method, apparatus, or non-transitory computer-readable medium of aspect 3 where the faulty connection includes an open transmission line or a short between a transmission line of the interface and a voltage source, between a transmission line of the interface and a voltage source a ground reference, or between a transmission line of the interface and another transmission line of the interface.

Aspect 5: The method, apparatus, or non-transitory computer-readable medium of any of aspects 1 through 4, further including operations, features, circuitry, logic, means, or instructions, or any combination thereof for comparing the first data to the second data and determining the connection status based at least in part on the comparison, where the indication of the connection status is transmitted based at least in part on determining the connection status.

Aspect 6: The method, apparatus, or non-transitory computer-readable medium of aspect 5, further including operations, features, circuitry, logic, means, or instructions, or any combination thereof for determining a mapping between the first set of transmission lines and the second set of transmission lines, where the comparison of the first data to the second data is based at least in part on the mapping.

Aspect 7: The method, apparatus, or non-transitory computer-readable medium of aspect 6, further including operations, features, circuitry, logic, means, or instructions, or any combination thereof for determining, based at least in part on the mapping, that a first transmission line of the first set of transmission lines is mapped to a second transmission line of the second set of transmission lines, where the comparison includes comparing a first bit of the first data received over the first transmission line to a first bit of the second data received over the second transmission line.

Aspect 8: The method, apparatus, or non-transitory computer-readable medium of any of aspects 5 through 7 where comparing the first data and the second data includes operations, features, circuitry, logic, means, or instructions, or any combination thereof for performing an XNOR operation on the first data and the second data.

Aspect 9: The method, apparatus, or non-transitory computer-readable medium of any of aspects 1 through 8, further including operations, features, circuitry, logic, means, or instructions, or any combination thereof for receiving a request for the connection status of the interface, where the indication of the connection status is transmitted based at least in part on the request.

Aspect 10: The method, apparatus, or non-transitory computer-readable medium of any of aspects 1 through 9, further including operations, features, circuitry, logic, means, or instructions, or any combination thereof for receiving, after receiving the first data and the second data, third data in a third pattern over the first set of transmission lines and fourth data in a fourth pattern over the second set of transmission lines, where the indication of the connection status of the interface is based at least in part on the third data and the fourth data.

Aspect 11: The method, apparatus, or non-transitory computer-readable medium of any of aspects 1 through 10 where the first set of transmission lines is configured for communication of command and address information and the second set of transmission lines includes a first subset of transmission lines configured for communication of data and a second subset of transmission lines configured for communication of control information.

Aspect 12: The method, apparatus, or non-transitory computer-readable medium of any of aspects 1 through 11, further including operations, features, circuitry, logic, means, or instructions, or any combination thereof for receiving a clock signal over a transmission line of the interface, where the first data and the second data are received synchronously with the clock signal.

Aspect 13: The method, apparatus, or non-transitory computer-readable medium of any of aspects 1 through 12, further including operations, features, circuitry, logic, means, or instructions, or any combination thereof for comparing the first data to the second data, where the indication includes a set of bits representative of a result of the comparison.

Figure 8:
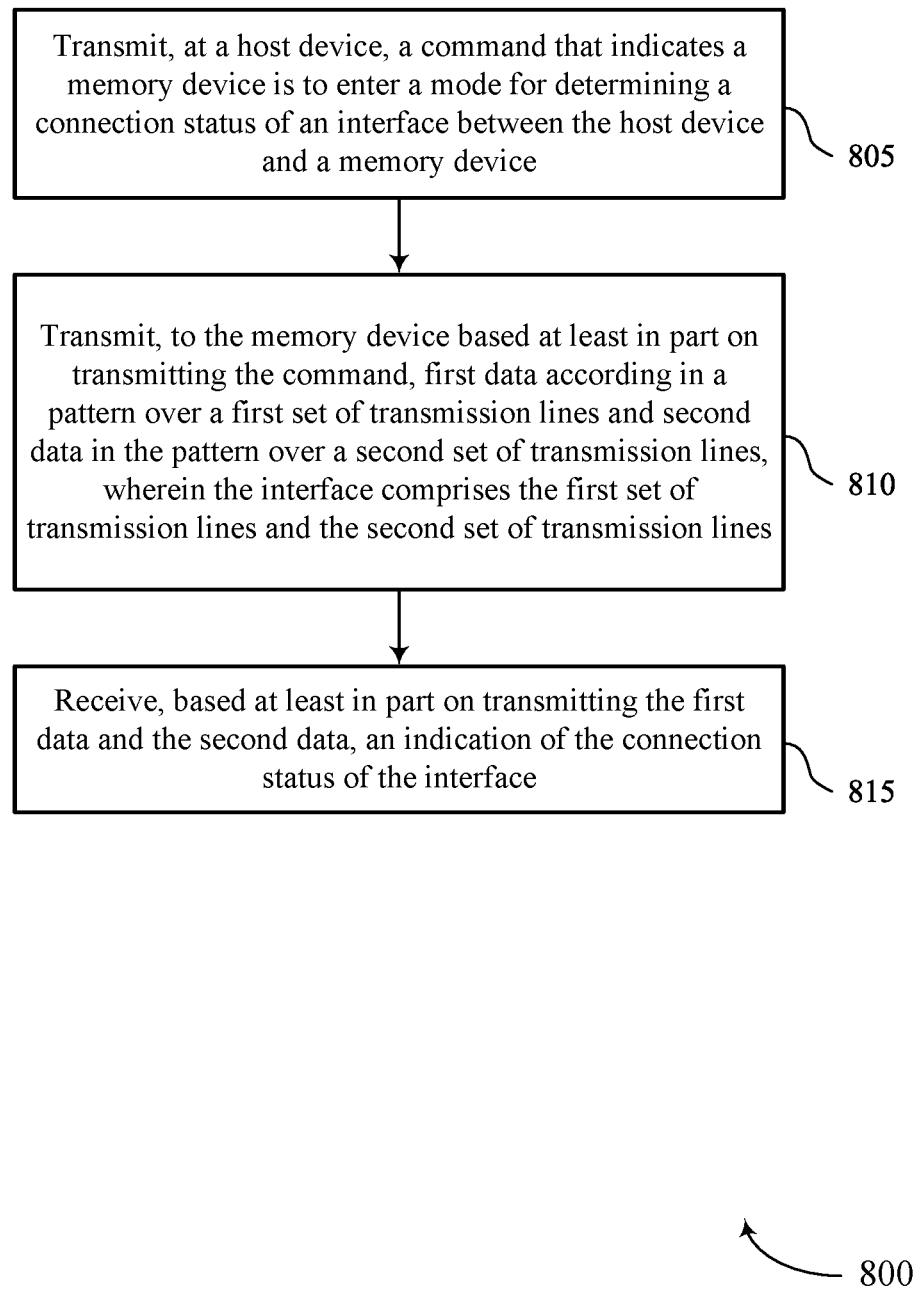

FIG. 8 shows a flowchart illustrating a method 800 that supports techniques for determining an interface connection status in accordance with examples as disclosed herein. The operations of method 800 may be implemented by a host device or its components as described herein. For example, the operations of method 800 may be performed by a host device as described with reference to FIGS. 1 through 4 and 6. In some examples, a host device may execute a set of instructions to control the functional elements of the device to perform the described functions. Additionally, or alternatively, the host device may perform aspects of the described functions using special-purpose hardware.

At 805, the method may include transmitting, at a host device, a command that indicates a memory device is to enter a mode for determining a connection status of an interface between the host device and a memory device. The operations of 805 may be performed in accordance with examples as disclosed herein. In some examples, aspects of the operations of 805 may be performed by a transmit circuitry 625 as described with reference to FIG. 6.

At 810, the method may include transmitting, to the memory device based at least in part on transmitting the command, first data according in a pattern over a first set of transmission lines and second data in the pattern over a second set of transmission lines, where the interface includes the first set of transmission lines and the second set of transmission lines. The operations of 810 may be performed in accordance with examples as disclosed herein. In some examples, aspects of the operations of 810 may be performed by a transmit circuitry 625 as described with reference to FIG. 6.

At 815, the method may include receiving, based at least in part on transmitting the first data and the second data, an indication of the connection status of the interface. The operations of 815 may be performed in accordance with examples as disclosed herein. In some examples, aspects of the operations of 815 may be performed by a receive circuitry 630 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 14: A method, apparatus, or non-transitory computer-readable medium including operations, features, circuitry, logic, means, or instructions, or any combination thereof for transmitting, at a host device, a command that indicates a memory device is to enter a mode for determining a connection status of an interface between the host device and a memory device; transmitting, to the memory device based at least in part on transmitting the command, first data according in a pattern over a first set of transmission lines and second data in the pattern over a second set of transmission lines, where the interface includes the first set of transmission lines and the second set of transmission lines; and receiving, based at least in part on transmitting the first data and the second data, an indication of the connection status of the interface.

Aspect 15: The method, apparatus, or non-transitory computer-readable medium of aspect 14 where the indication of the connection status indicates that the interface has a faulty connection and the method, apparatuses, and non-transitory computer-readable medium, further includes operations, features, circuitry, logic, means, or instructions, or any combination thereof for entering a safe mode based at least in part on the indication of the connection status indicating that the interface has a faulty connection.

Aspect 16: The method, apparatus, or non-transitory computer-readable medium of aspect 15 where entering the safe mode includes operations, features, circuitry, logic, means, or instructions, or any combination thereof for indicating for the vehicle to pull over and transferring control of the vehicle from the vehicle to a user of the vehicle.

Aspect 17: The method, apparatus, or non-transitory computer-readable medium of any of aspects 15 through 16 where the faulty connection includes an open transmission line or a short between a transmission line of the interface and a voltage source, between a transmission line of the interface and a ground reference, or between a transmission line of the interface and another transmission line of the interface.

Aspect 18: The method, apparatus, or non-transitory computer-readable medium of any of aspects 14 through 17, further including operations, features, circuitry, logic, means, or instructions, or any combination thereof for transmitting, after transmitting the first data and the second data, a request for the connection status, where the indication of the connection status is received based at least in part on transmitting the request.

Aspect 19: The method, apparatus, or non-transitory computer-readable medium of any of aspects 14 through 18, further including operations, features, circuitry, logic, means, or instructions, or any combination thereof for determining that a timer for checking the connection status of the interface has expired, where the command to enter the mode for determining the connection status of the interface is transmitted based at least in part on the timer expiring.

Aspect 20: The method, apparatus, or non-transitory computer-readable medium of any of aspects 14 through 19, further including operations, features, circuitry, logic, means, or instructions, or any combination thereof for determining a mapping between the first set of transmission lines and the second set of transmission lines, where the first data and the second data are transmitted based at least in part on the mapping.

Aspect 21: The method, apparatus, or non-transitory computer-readable medium of aspect 20, further including operations, features, circuitry, logic, means, or instructions, or any combination thereof for determining, based at least in part on the mapping, that a first transmission line of the first set of transmission lines is mapped to a second transmission line of the second set of transmission lines, where a first bit of the first data is transmitted over the first transmission line and a first bit of the second data is transmitted over the second transmission line based at least in part on the first transmission line being mapped to the second transmission line.

Aspect 22: The method, apparatus, or non-transitory computer-readable medium of any of aspects 14 through 21, further including operations, features, circuitry, logic, means, or instructions, or any combination thereof for transmitting, to the memory device and based at least in part on transmitting the command, third data representative of a second pattern over the first set of transmission lines and fourth data representative of the second pattern over the second set of transmission lines, where the indication of the connection status is based at least in part on transmitting the third data and the fourth data.

Aspect 23: The method, apparatus, or non-transitory computer-readable medium of any of aspects 14 through 22 where the command includes a write command for a mode register of the memory device.

Aspect 24: The method, apparatus, or non-transitory computer-readable medium of any of aspects 14 through 23 where the first set of transmission lines is configured for communication of command and address information and the second set of transmission lines includes a first subset of transmission lines configured for communication of data and a second subset of transmission lines configured for communication of control information.

Aspect 25: The method, apparatus, or non-transitory computer-readable medium of any of aspects 14 through 24, further including operations, features, circuitry, logic, means, or instructions, or any combination thereof for transmitting a clock signal over a transmission line of the interface, where the first data and the second data are transmitted synchronously with the clock signal.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 26: An apparatus, including: a memory device; and a controller coupled with the memory device and configured to cause the apparatus to: receive, at the memory device, a command that indicates the memory device is to enter a mode for determining a connection status of an interface between a host device and the memory device; receive, based at least in part on receiving the command, first data in a first pattern over a first set of transmission lines and second data in a second pattern over a second set of transmission lines, where the interface includes the first set of transmission lines and the second set of transmission lines; and transmit, based at least in part on receiving the first data and the second data, an indication of the connection status of the interface.

Aspect 27: The apparatus of aspect 26, where the controller is further configured to cause the apparatus to: determine that the first pattern and the second pattern are the same, where the indication of the connection status indicates that the interface has correct connections.

Aspect 28: The apparatus of any of aspects 26 through 27, where the controller is further configured to cause the apparatus to: determine that the first pattern and the second pattern are different, where the indication of the connection status indicates that the interface has a faulty connection.

Aspect 29: The apparatus of any of aspects 26 through 28, where the controller is further configured to cause the apparatus to: compare the first data to the second data; and determine the connection status based at least in part on the comparison, where the indication of the connection status is transmitted based at least in part on determining the connection status.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
  receiving, at a memory device, a command that indicates the memory device is to enter a mode for determining a connection status of an interface between a host device and the memory device;
  comparing, by the memory device based at least in part on entering the mode for determining the connection status of the interface, first data in a first pattern received over a first set of transmission lines to second data in a second pattern received over a second set of transmission lines different than the first set of transmission lines, wherein the interface comprises the first set of transmission lines and the second set of transmission lines; and
  transmitting, by the memory device based at least in part on comparing the first data and the second data, an indication of the connection status of the interface.

2. The method of claim 1, further comprising:
  determining that the first pattern and the second pattern are equal, wherein the indication of the connection status indicates that the interface has correct connections.

3. The method of claim 1, further comprising:
  determining that the first pattern and the second pattern are different, wherein the indication of the connection status indicates that the interface has a faulty connection.

4. The method of claim 3, wherein the faulty connection comprises:
  an open transmission line; or
  a short between a transmission line of the interface and a voltage source, between a transmission line of the interface and a voltage source a ground reference, or between a transmission line of the interface and another transmission line of the interface.

5. A method, comprising:
  receiving, at a memory device, a command that indicates the memory device is to enter a mode for determining a connection status of an interface between a host device and the memory device;
  receiving, based at least in part on receiving the command, first data in a first pattern over a first set of transmission lines and second data in a second pattern over a second set of transmission lines, wherein the interface comprises the first set of transmission lines and the second set of transmission lines;
  determining a mapping between the first set of transmission lines and the second set of transmission lines;
  determining, based at least in part on the mapping, that a first transmission line of the first set of transmission lines is mapped to a second transmission line of the second set of transmission lines;
  comparing the first data to the second data based at least in part on the mapping, wherein comparing the first data to the second data comprises comparing a first bit of the first data received over the first transmission line to a first bit of the second data received over the second transmission line;

determining the connection status based at least in part on comparing the first data to the second data; and transmitting, based at least in part on receiving the first data and the second data and based at least in part on determining the connection status, an indication of the connection status of the interface.

6. The method of claim 5, wherein comparing the first data and the second data comprises:

performing an XNOR operation on the first data and the second data.

7. The method of claim 1, further comprising:

receiving a request for the connection status of the interface, wherein the indication of the connection status is transmitted based at least in part on the request.

8. The method of claim 1, further comprising:

receiving, after receiving the first data and the second data, third data in a third pattern over the first set of transmission lines and fourth data in a fourth pattern over the second set of transmission lines, wherein the indication of the connection status of the interface is based at least in part on the third data and the fourth data.

9. The method of claim 1, wherein the first set of transmission lines is configured for communication of command and address information, and wherein the second set of transmission lines comprises a first subset of transmission lines configured for communication of data and a second subset of transmission lines configured for communication of control information.

10. The method of claim 1, further comprising:

receiving a clock signal over a transmission line of the interface, wherein the first data and the second data are received synchronously with the clock signal.

11. The method of claim 1, further comprising:

comparing the first data to the second data, wherein the indication comprises a set of bits representative of a result of comparing the first data to the second data.

12. A method, comprising:

transmitting, at a host device, a command that indicates a memory device is to enter a mode for determining a connection status of an interface between the host device and the memory device;

determining a mapping between a first set of transmission lines and a second set of transmission lines;

determining, based at least in part on the mapping, that a first transmission line of the first set of transmission lines is mapped to a second transmission line of the second set of transmission lines;

transmitting, to the memory device based at least in part on transmitting the command, first data according in a pattern over the first set of transmission lines and second data in the pattern over the second set of transmission lines, wherein the interface comprises the first set of transmission lines and the second set of transmission lines, and wherein a first bit of the first data is transmitted over the first transmission line and a first bit of the second data is transmitted over the second transmission line based at least in part on the first transmission line being mapped to the second transmission line; and receiving, based at least in part on transmitting the first data and the second data, an indication of the connection status of the interface.

13. A method, comprising:

transmitting, at a host device, a command that indicates a memory device is to enter a mode for determining a connection status of an interface between the host device and the memory device, wherein the host device is included in a vehicle;

transmitting, to the memory device based at least in part on transmitting the command, first data according in a pattern over a first set of transmission lines and second data in the pattern over a second set of transmission lines, wherein the interface comprises the first set of transmission lines and the second set of transmission lines;

receiving, based at least in part on transmitting the first data and the second data, an indication of the connection status of the interface, wherein the indication of the connection status indicates that the interface has a faulty connection; and entering a safe mode based at least in part on the indication of the connection status indicating that the interface has the faulty connection, wherein entering the safe mode comprises:

indicating for the vehicle to pull over; or transferring control of the vehicle from the vehicle to a user of the vehicle.

14. The method of claim 13, wherein the faulty connection comprises:

an open transmission line; or a short between a transmission line of the interface and a voltage source, between a transmission line of the interface and a ground reference, or between a transmission line of the interface and another transmission line of the interface.

15. The method of claim 12, further comprising:

transmitting, after transmitting the first data and the second data, a request for the connection status, wherein the indication of the connection status is received based at least in part on transmitting the request.

16. A method, comprising:

determining that a timer for checking a connection status of an interface has expired;

transmitting, at a host device, a command that indicates a memory device is to enter a mode for determining the connection status of the interface between the host device and the memory device, wherein the command to enter the mode for determining the connection status of the interface is transmitted based at least in part on the timer expiring;

transmitting, to the memory device based at least in part on transmitting the command, first data according in a pattern over a first set of transmission lines and second data in the pattern over a second set of transmission lines, wherein the interface comprises the first set of transmission lines and the second set of transmission lines; and receiving, based at least in part on transmitting the first data and the second data, an indication of the connection status of the interface.

17. The method of claim 12, further comprising:

transmitting, to the memory device and based at least in part on transmitting the command, third data representative of a second pattern over the first set of transmission lines and fourth data representative of the second pattern over the second set of transmission lines, wherein the indication of the connection status is based at least in part on transmitting the third data and the fourth data.

18. The method of claim 12, wherein the command comprises a write command for a mode register of the memory device.

19. The method of claim 12, wherein the first set of transmission lines is configured for communication of command and address information, and wherein the second set of transmission lines comprises a first subset of transmission lines configured for communication of data and a second subset of transmission lines configured for communication of control information.

20. The method of claim 12, further comprising:
    transmitting a clock signal over a transmission line of the interface, wherein the first data and the second data are transmitted synchronously with the clock signal.

21. An apparatus, comprising:
    a memory device; and
    a controller coupled with the memory device and configured to cause the apparatus to:
        receive, at the memory device, a command that indicates the memory device is to enter a mode for determining a connection status of an interface between a host device and the memory device;
        compare, based at least in part on entering the mode for determining the connection status of the interface, first data in a first pattern received over a first set of transmission lines to second data in a second pattern received over a second set of transmission lines different than the first set of transmission lines, wherein the interface comprises the first set of transmission lines and the second set of transmission lines; and
        transmit, based at least in part on receiving the first data and the second data, an indication of the connection status of the interface.

22. The apparatus of claim 21, wherein the controller is further configured to cause the apparatus to:
    determine that the first pattern and the second pattern are equal, wherein the indication of the connection status indicates that the interface has correct connections.

23. The apparatus of claim 21, wherein the controller is further configured to cause the apparatus to:
    determine that the first pattern and the second pattern are different, wherein the indication of the connection status indicates that the interface has a faulty connection.

24. The apparatus of claim 21, wherein the controller is further configured to cause the apparatus to:
    determine the connection status based at least in part on comparing the first data to the second data, wherein the indication of the connection status is transmitted based at least in part on determining the connection status.

* * * * *